(12) United States Patent
Lippincott

(10) Patent No.: US 6,618,831 B2
(45) Date of Patent: Sep. 9, 2003

(54) INCREASING PERFORMANCE WITH MEMORY COMPRESSION

(75) Inventor: Louis A. Lippincott, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/748,087

(22) Filed: Dec. 21, 2000

(65) Prior Publication Data

US 2002/0124222 A1 Sep. 5, 2002

(51) Int. Cl.[7] ............................................. H03M 13/31
(52) U.S. Cl. .................... 714/752; 714/702; 341/61; 341/95
(58) Field of Search .............................. 341/55, 61, 87, 341/95; 714/702, 752; H03M 13/31

(56) References Cited

U.S. PATENT DOCUMENTS 4,903,270 A * 2/1990 Johnson et al. ............. 714/820
6,362,756 B1 * 3/2002 Shannon ...................... 341/87
6,532,012 B2 * 3/2003 Deering ...................... 345/423

* cited by examiner

Primary Examiner—R. Stephen Dildine
(74) Attorney, Agent, or Firm—Blakely, Sokoloff, Taylor & Zafman LLP

(57) ABSTRACT

A bandwidth disparity often exists between the front side bus bandwidth and the memory interface bandwidth. The invention effectively increases the bandwidth of a memory interface bandwidth for increasing central processing unit performance. In one aspect, data is buffered by a memory controller hub and compressed by dropping data elements if repetitious data elements appear in a data stream. The dropped data elements are indicated by tagging a previous data element for later recovery. In another aspect, tagging is provided by modifying error correction code bits of the tagged data element or by modifying the data elements. In another aspect, dropped data elements are detected by identification of an error correction code, the dropped data elements reinserted into the data stream, and the data buffered before being presented to a front side bus.

28 Claims, 2 Drawing Sheets

INCREASING PERFORMANCE WITH MEMORY COMPRESSION

FIELD

This invention relates to memory compression, more particularly, effectively increasing the bandwidth of a memory interface for increasing central processing unit performance by dropping repeated data elements in a data stream, the dropped data elements identified by tagging to cause an error correction code error for later recovery.

BACKGROUND

Typically, when data is transferred from a central processing unit (CPU) to a memory controller hub (MCH) and then to memory, a bandwidth disparity exists. That is, the bandwidth of the CPU to MCH connection, usually a front side bus (FSB), is higher than the bandwidth of a MCH to memory connection, a memory interface (MI). The FSB often operates at speeds of 500 mega-hertz (MHz.), while the MI often operates at lower speeds such as 100 MHz. or 133 MHz. Since the width of the data bus on both interfaces is usually the same, the effective bandwidth is much higher on the FSB. Everything else being equal, data passing from memory to the CPU would be limited by the MI, not by the FSB. That is, because advancements in CPU speed have outpaced advancements in memory speed, the slower MI speed effects CPU performance.

BRIEF DESCRIPTION OF THE DRAWINGS

Additional advantages of the invention will become apparent upon reading the following detailed description and upon reference to the drawings, in which.

DETAILED DESCRIPTION

Exemplary embodiments are described with reference to specific configurations. Those skilled in the art will appreciate that various changes and modifications can be made while remaining within the scope of the claims.

Techniques exist to compress memory data for the purpose of extending memory capacity. While these techniques may yield effectively more data storage space, they have negative impacts on CPU performance. Conventional methods use methods other than direct tagging, and therefore must include the overhead of marking compressed data in the data itself. Generally, the marking overhead is merged with the data to form data packets of significant size, since the overhead must be amortized over large chunks of data to be effective for compression. Otherwise, the overhead negates the gains from compression. Also, using memory locations that are compressed out of the data stream to gain memory capacity increases the complexity of the methods used. The increased complexity of these methods can prevent gains in CPU performance that would otherwise be obtained. The present invention provides an apparatus, method and means for memory compression for increased CPU performance. In an embodiment of the present invention, the data is compressed before being sent across the MI, and an increase in the effective bandwidth of the MI results. For example, if a CPU sends 64 bytes across a FSB, and the invention compresses these bytes so that 32 bytes are sent across a MI, then the peak bandwidth of the MI has effectively doubled from the perspective of the CPU.

Figure 1:
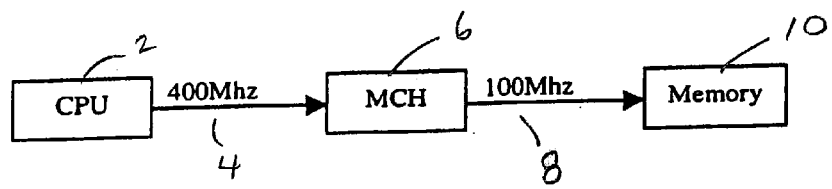
FIG. 1 is a block diagram depicting the transfer of data from the CPU to memory, in an embodiment of the present invention.
Figure 2:
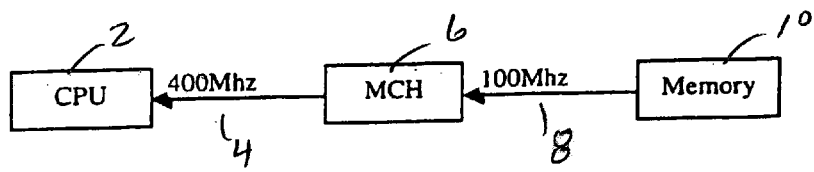
FIG. 2 is a block diagram depicting the transfer of data from the memory to the CPU, in an embodiment of the present invention.

As shown in FIG. 1, as an example of an embodiment of the present invention, data is transferred from CPU 2 to MCH 6. CPU 2 is coupled to FSB 4 that operates at 400 MHz., and 8 bytes wide. MI 10, also 8 bytes wide, operates at 100 MHz. MCH 6 buffers data from CPU 2 and presents the data to Memory 10. MCH 6 receives data faster than memory 10 receives data. Data is received by MCH 6 in packets, called cache lines, of a predetermined length such as 64 bytes, buffers the data and presents it to memory 10 at a slower speed. In an embodiment, MCH 6 is configured to hold a predetermined number of cache lines depending on the gates allocated to the buffering of the data from CPU 2. Alternatively, as shown in FIG. 2, as an example of an embodiment of the present invention, data is transferred from memory 10 to CPU 2. MCH 6 receives data from MI 8 at 100 MHz., a lower speed than FSB 4, and MCH 6 buffers the data before presenting it to CPU 2 at 400 MHz.

Figure 3:
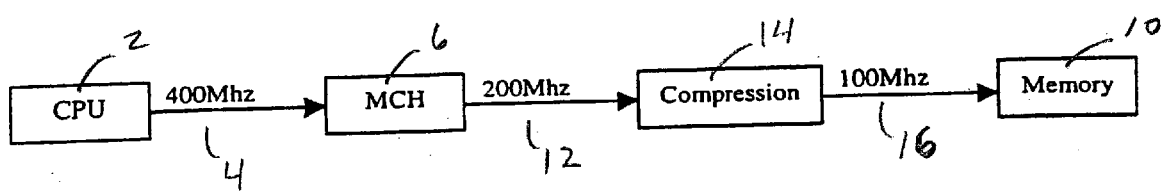
FIG. 3 is a block diagram depicting the transfer of data including a compression/decompression function, in an embodiment of the present invention.

In an embodiment, memory use decisions are not utilized, since compression is enabled for memory, thereby adding to the efficiency of the present invention. As shown in FIG. 3, as an example, compression 14, being coupled to MCH 6, but separate from MCH 6, compresses data passing through it. Interface 12 operates at 200 MHz., and MI 16 operates at 100 MHz., the compression being 2:1 in the best case and 1:1 in the worst case. The compression of the data causes the operation on MI 16 to conclude sooner than without compression, allowing a later cache line from CPU 2, buffered in MCH 6, to begin transferring earlier on MI 16. From the perspective of CPU 2, the bandwidth of MI 16 is higher than without compression 14. In another embodiment, MCH 6 includes compression operations.

In an embodiment of the invention, alternatively, during a read operation of CPU 2, data is transferred to compression 14 at 100 MHz. and gets expanded. Once expanded, data is transferred to MCH 6 at 200 MHz., gets buffered, and is transferred to CPU 2 at 400 MHz. When the data expands into a full cache line, the memory read operation is terminated. An early termination allows the next read operation to begin sooner, increasing the effective bandwidth for read operations.

As shown in Table 1, an example of an embodiment of the present invention, data elements are read in pairs. Within each data element pair, if the following consecutive data element is the same as the previous data element, then the later data element is dropped. The dropped data element is indicated by tagging the previous data element, connoting that the later data element is to be repeated and inserted in the data stream during decompression. Compressed data elements are not written to memory. Table 1 is an example of a set of uncompressed data elements and the result of compression. A data element can be represented by the smallest number of bytes that can be isolated during a read or a write operation, and is typically determined by the width of the data bus.

TABLE 1

| UNCOMPRESSED DATA ELEMENTS | COMPRESSED DATA ELEMENTS | TAG |
|---|---|---|
| 01A23BE3 | 01A23BE3 | Off |
| 00000000 | 00000000 | Off |
| 00000000 | 00000000 | On |
| 00000000 | XXXXXXXX | X |
| 564A63DE | 564A63DE | Off |
| ADE123B4 | ADE123B4 | Off |
| FE776DAC | FE776DAC | On |
| FE776DAC | XXXXXXXX | X |

As shown in Table 1, two data elements, 00000000 and FE776DAC are compressed out of the data stream and are not transferred to memory 10, saving two clock periods on MI 16. The space reserved for the two data elements compressed indicated by "compressed data elements" denoted "XXXXXXXX" remains unused. The addresses that would normally hold the uncompressed data are now indeterminate since they are not accessed. Alternatively, as shown in Table 2, in an embodiment, the unused areas of memory appears at the end of the cache lines.

TABLE 2

| UNCOMPRESSED DATA ELEMENTS | COMPRESSED DATA ELEMENTS | TAG |
|---|---|---|
| 01A23BE3 | 01A23BE3 | Off |
| 00000000 | 00000000 | Off |
| 00000000 | 00000000 | On |
| 00000000 | 564A63DE | Off |
| 564A63DE | FE776DAC | Off |
| ADE123B4 | ADE123B4 | On |
| FE776DAC | XXXXXXXX | X |
| FE776DAC | XXXXXXXX | X |

As shown in Table 3, an example of an embodiment of the present invention, data elements are not read in pairs, rather a series of data elements is read. If any consecutive data elements are the same then the later data element is dropped. The dropped data element is indicated by tagging the previous data element, connoting that the later data element is to be repeated and inserted in the data stream during decompression. Compressed data elements are not written to memory, instead the data elements are skipped and the previous data element is tagged. Table 3 is an example of a set of uncompressed data elements and the result of compression. In an embodiment, the unused areas of memory caused by compression can appear at the end of the cache lines. Alternatively, in an embodiment, the unused areas of memory can be skipped in place.

TABLE 3

| UNCOMPRESSED DATA ELEMENTS | COMPRESSED DATA ELEMENTS | TAG |
|---|---|---|
| 01A23BE3 | 01A23BE3 | Off |
| 00000000 | 00000000 | On |
| 00000000 | 00000000 | Off |
| 00000000 | 564A63DE | Off |
| 564A63DE | FE776DAC | Off |
| ADE123B4 | ADE123B4 | On |
| FE776DAC | XXXXXXXX | X |
| FE776DAC | XXXXXXXX | X |

Figure 4:
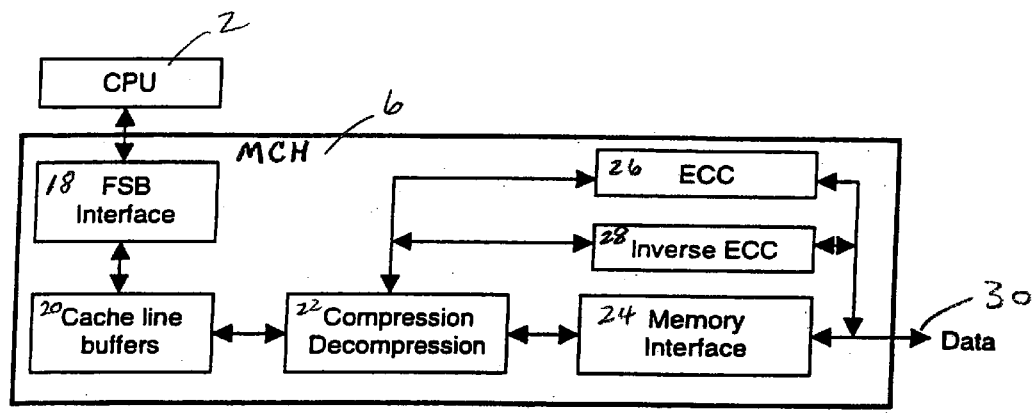
FIG. 4 is a block diagram depicting a MCH providing buffer, compression/decompression and error correction code (ECC) modification operations, in an embodiment of the present invention.

As shown in FIG. 4, in an embodiment, MCH 6 includes FSB interface 18, cache line buffer 20, compression/decompression 22, error correction code (ECC) operation 26, inverse ECC operation 28, and MI 24. MCH 6 is coupled to CPU 2, and to data 30. In another embodiment, at least one of compression/decompression 22, ECC operation 26, inverse ECC operation 28, and cache line buffers 20 are coupled to MCH 6, not included within MCH 6.

In an embodiment, tagging of the data elements is provided by modifying the ECC bits, causing an ECC error. The ECC bits are modified by inverting the ECC bits. Tagging is provided in a way to retain ECC protection afforded by the original number of bits. Alternatively, in an embodiment, the ECC bits are modified by adding an offset to the ECC bits. In another embodiment, tagging is provided by modifying data elements, causing an ECC error. In an embodiment, other methods to tag data elements include adding additional bits per data element, adding a separate tag memory to hold all tag bits, etc.

In an embodiment, when data is read, tags are detected by ECC operation 26 and inverse ECC operation 28 data elements tagged are detagged, and the data elements coinciding with the tags are repeated by decompression 22, reconstructing the data stream. Once reconstructed, data is buffered by cache line buffer 20, then sent to CPU 2.

In an embodiment, when the data elements are read, an ECC error would be caused by at least one of inverted ECC bits, an offset added to ECC bits, and modified data elements. In an embodiment, if inverted ECC bits exist, inverse ECC inverts the ECC bits. After correcting an ECC error, including inverting ECC bits, removing an added offset, and removing the modification to the data elements, if the ECC error no longer exists, then the ECC error is interpreted by ECC operation 26 and inverse ECC operation 28 to be a tagged data element. If the ECC error remains, then a true ECC error exists and is reported by compression 14.

Figure 5:
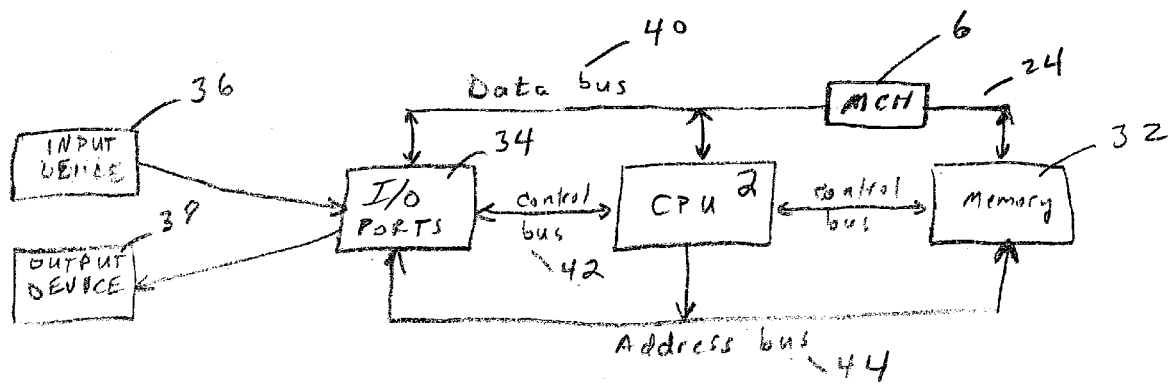
FIG. 5 is a block diagram depicting the present invention utilized within a microprocessor, in an embodiment of the present invention.

In an embodiment, as shown in FIG. 5, system 46 is provided. System 46 includes MCH 6, input/output (I/O) port 34, CPU 2, and memory 32 and MI 24. In an embodiment, input device 36 and output device 38 are connected with system 46. In an embodiment, MCH 6 includes an apparatus having a buffer, a means for dropping at least one repeated data element from a data stream, and a means for tagging at least one data element. In an embodiment, MCH 6 includes an apparatus having a buffer, a means for detecting at least one data element tag, a means for detagging at least one data element and a means for repeating and inserting at least one data element into a data stream. In an embodiment, an ECC error is caused to tag the data element. In an embodiment, an ECC error is corrected to detag the data element. In an embodiment, at least one of ECC bits are modified and data elements are modified to cause the ECC error. In an embodiment at least one of ECC bits are modified and data elements are modified to correct the ECC error. In an embodiment, system 46 includes at least one of control bus 42, data bus 40, and address bus 44. In an embodiment, MI 24 includes at least one of control bus 42, data bus 40, and address bus 44. In another embodiment, at least one of compression/decompression 22, ECC operation 26, inverse ECC operation 28, and cache line buffers 20 are coupled to MCH 6, not included within MCH 6.

Having disclosed exemplary embodiments, modifications and variations may be made to the disclosed embodiments while remaining within the spirit and scope of the invention as defined by the appended claims.

What is claimed is:

1. A method comprising:
   buffering data;

dropping at least one repeated data element from a data stream; and tagging at least one data element.

2. The method as in claim 1, wherein said tagging comprises causing an error correction code (ECC) error.

3. The method as in claim 2, wherein causing said ECC error comprises modifying ECC bits.

4. The method as in claim 2, wherein causing said ECC error comprises modifying said data elements.

5. The method as in claim 3, wherein modifying said ECC bits comprises at least one of inverting said ECC bits and adding an offset to said ECC bits.

6. The method as in claim 1, wherein said tagging comprises tagging the smallest number of bytes isolated during at least one of a read operation and a write operation.

7. A method comprising:

detecting at least one data element tag;

detagging at least one data element;

repeating and inserting at least one data element into a data stream; and buffering data.

8. The method as in claim 7, wherein said detagging comprises detagging the smallest number of bytes isolated during at least one of a read operation and a write operation.

9. The method as in claim 7, wherein said detagging comprises correcting an error correction code (ECC) error.

10. The method as in claim 9, wherein correcting said ECC error comprises modifying ECC bits.

11. The method as in claim 9, wherein correcting said ECC error comprises modifying data elements.

12. The method as in claim 10, wherein modifying said ECC bits comprises at least one of inverting said ECC bits and removing an offset to said ECC bits.

13. An apparatus comprising:

a buffer;

a compression device to drop at least one repeated data element from a data stream; and a tagging device, coupled with said buffer and said compression device, to tag at least one data element.

14. The apparatus as in claim 13, wherein said tagging device selectively causes an error correction code (ECC) error.

15. The apparatus as in claim 14, wherein said tagging device causes said ECC error by modifying at least one of ECC bits and said data elements.

16. The apparatus as in claim 15, wherein said tagging device modifies said ECC bits by at least one of inverting said ECC bits and adding an offset to said ECC bits.

17. The apparatus as in claim 13, further comprising a memory controller hub (MCH), coupled with said compression device, to receive said data elements from a front side bus (FSB), and send said data elements to a memory interface (MI).

18. An apparatus comprising:

a detecting device to detect at least one data element tag;

a detagging device to detag at least one data element;

a decompression device to repeat and insert at least one data element into a data stream; and a buffer, coupled with said detecting device, said detagging device, and said decompression device.

19. The apparatus as in claim 18, wherein said detagging device selectively corrects an error correction code (ECC) error.

20. The apparatus as in claim 19, wherein said detagging device corrects said ECC error by modifying at least one of ECC bits and said data elements.

21. The apparatus as in claim 20, wherein said detagging device modifies said ECC bits by at least one of inverting said ECC bits and removing an offset to said ECC bits.

22. The apparatus as in claim 18, further comprising a memory controller hub (MCH), coupled with said decompression device, to receive said data elements from a memory interface (MI), and send said data elements to a front side bus (FSB).

23. A system comprising:

an input/output (I/O) port;

a memory;

a microprocessor; and a memory controller hub;

wherein said memory, said I/O port, said memory controller hub, and said microprocessor are connected by a control bus, a data bus, and an address bus; and wherein said memory controller hub having a buffer, a compression device to drop at least one repeated data element from a data stream, and a tagging device to tag at least one data element.

24. The system as in claim 23, wherein said tagging device selectively causes an error correction code (ECC) error.

25. The system as in claim 24, wherein said tagging device causes said ECC error by modifying at least one of ECC bits and said data elements.

26. A system comprising:

an input/output (I/O) port;

a memory;

a microprocessor; and a memory controller hub;

wherein said memory, said I/O port, said memory controller hub, and said microprocessor are connected by a control bus, a data bus, and an address bus; and wherein said memory controller hub having a detecting device to detect at least one data element tag, a detagging device to detag at least one data element, a decompression device to repeat and insert at least one data element into a data stream, and a buffer.

27. The system as in claim 26, wherein said detagging device selectively corrects an error correction code (ECC) error.

28. The system as in claim 27, wherein said detagging device corrects said ECC error by modifying at least one of ECC bits and said data elements.

* * * * *